Sept. 20, 1966 S. TESZNER 3,274,461

HIGH FREQUENCY AND POWER FIELD EFFECT TRANSISTOR WITH MESH-LIKE GATE STRUCTURE

Filed Dec. 11, 1962 3 Sheets-Sheet 1

INVENTOR
STANISLAS TESZNER
BY
Abraham A. Saffitz
ATTORNEY

INVENTOR
STANISLAS TESZNER
BY
Abraham A. Saffitz
ATTORNEY

INVENTOR
STANISLAS TESZNER
BY
Abraham A. Saffitz
ATTORNEY

United States Patent Office 3,274,461
Patented Sept. 20, 1966

3,274,461
HIGH FREQUENCY AND POWER FIELD EFFECT TRANSISTOR WITH MESH-LIKE GATE STRUCTURE

Stanislas Teszner, 49 Rue de la Tour, Paris, France
Filed Dec. 11, 1962, Ser. No. 243,793
Claims priority, application France, Dec. 16, 1961, 822,222
13 Claims. (Cl. 317—235)

The present invention relates to semiconductor signal translating devices and more particularly to field-effect devices of the so-called multi-rod tecnetron type.

Multi-rod tecnetrons are described in U.S. Patent No. 2,930,950 issued on March 29, 1960, to the present applicant. In a general way, the multi-rod tecnetrons of the various known types which will be referred to hereafter in further detail, comprise a base of semiconductor material, a number of rods perpendicular to that base, a control electrode in one piece surrounding each rod along a portion of its height and having a rectifying contact or forming a junction therewith and two terminal ohmic electrodes, the one welded onto the base and the other welded to the terminals of all the rods. The rods can be physically apparent and external to the base in the manner of the bristles of a brush, or inside the base in the form of unaltered parts, substantially cylindrical, embedded in a semi-conductor part of a type of conductivity opposite to that of the base plate and obtained by the diffusion of an appropriate impurity through a mask. Whatever the structure employed, whether with rods outside or inside the base plate, the operation of welding an electrode in the form of a plate onto the tops of a great number of rods is delicate and complex.

One object of the present invention is to avoid, in multi-rod tecnetrons, the necessity of welding an electrode in the form of a plate on the extremity of a plurality of rods or teeth.

Field-effect transistors have also been proposed which comprise a relatively thick intermediate slab of semiconducting material, discrete cylindrical elements diffused in said slab and upper and lower semiconductor layers deposited on the slab by vapor phase pyrolysis. These field-effect transistors can be termed three layer transistors. As semiconductor slabs cannot be sliced up with a thickness less than a few tens of microns, these field-effect transistors are limited to low operational frequencies due to the length of the cylindrical elements being equal to the slab thickness.

Another object of the invention is to increase the limit operational frequency for a given output power of the low-power tecnetrons, in particular of the said tecnetrons used in oscillators and amplifiers, and also to reduce their rate of feedback.

A further object of the invention is to noticeably increase the performanceof the high power tecnetrons, particularly in their use as controlled rectifiers and as switching devices, by reducing the voltage drop in the "on" state and the value of the residual current in the "off" state.

A further object of the invention is to provide multi-rod tecnetrons with two control electrodes.

The multi-rod tecnetron of the invention is a tecnetron in which the rods or teeth are inside a semiconductor body or plate and form a net-like gate, the teeth of the semiconductor body playing the part of the meshes of the net and the wires of the same being constituted by a semiconductor part having a type of conductivity opposite to that of the body, the said gate being "embedded" in the semiconductor body. By embedding is meant the fact that a layer of a semiconductor homogenous to that of which the plate is made and integral thereto covers on both sides the heterogeneous part where regions of semiconductor of the two types of conductivity are adjacent, constituting the wires and the meshes of the gate.

The first layer of homogenous semiconductor located on one side of the gate is constituted by the mere semiconductor plate and it is arranged in such a way that the part forming the net, and which is achieved by diffusion, penetrates only to a fraction of the thickness of the plate. The second layer of homogenous semiconductor located on the other side of the gate is obtained by epitaxial growth or by another process hereinafter described. Due to the existence of this second layer, the two terminal electrodes can both be welded on to the level surface of a semiconductor body, which is considerably easier than to weld an electrode on to numerous regions of a very small surface. Further, as the teeth are diffused from the free face of the body and as the second layer is obtained either by epitaxial growth or by bringing back a small layer of semiconductor material having parts of different conductivity types to a unique conductivity type, the length of the teeth can be made as small as desired and can be assuredly made positively smaller than in the case of three layer field-effect transistors.

In the past, it has been suggested for the manufacture of analogue transistors to cut in a high specific resistivity substantially intrinsic material semiconductor body, of n-type for example, a plurality of bores of a few mils diameter, parallel to the faces of the body, to introduce an acceptor, indium for example, into the bores, to heat the assembly thereby fusing the inserted material to the surrounding semiconductor body and then to heavily dope the faces of the body thereby forming source and drain electrodes. In these analogue transistors, gate similar to the rungs of a ladder or, in other words, gates disposed in a linear array, were formed, said rungs being parallel to both source and drain electrodes. These prior teachings cannot be used for manufacturing the gate of the multi-rod field-effect transistors of the present invention because the present gate is not a linear array gate but rather a net-like or sieve-like gate having rod-shaped mesh-like element the general direction of which is perpendicular to the drain and source electrodes. Further, the net-like gates which are conceived as an important aspect of the present invention have as many as several thousand mesh-like elements per square millimeter which obviously cannot be obtained by a drilling process.

As will be more fully explained later, the mesh-like elements or teeth of the gate are produced by a diffusion process into a semiconductor plate through the holes of an oxide mask covering a face of the plate, and this diffusion is stopped by a positive step before the top of the semiconductor volume which is affected by the diffusion reaches the other or opposite face of the plate. The teeth elements are the portions of the semiconductor body which are unaltered by the diffusion treatment. Since the diffusion through the holes is substantially omnidirectional; e.g. proceeds in every direction, the cross section of the diffused portion decreases as one goes deeper into the plate and correlatively the section of the non-diffused teeth increases as one goes deeper, the minimum section being at the surface of the plate. These variable section teeth provide highly favorable results as fully explained in U.S. Patent No. 2,939,057 which was issued on May 31, 1960, to the present applicant.

The invention and the several features thereof will be understood more clearly and fully from the following detailed description with reference to the accompanying drawing in which:

FIGS. 1 to 4 and FIG. 4*a* represent multi-rod tecnetrons as hitherto known;

FIGS. 5 and 6 are cross-sectional views, taken along lines 5—5 and 6—6 respectively of a one-gate tecnetron conforming to the invention;

Figure 1:
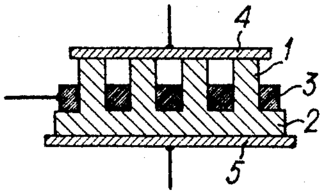
Figure 2:
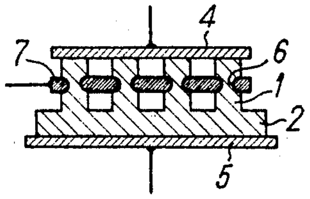
Figure 3:
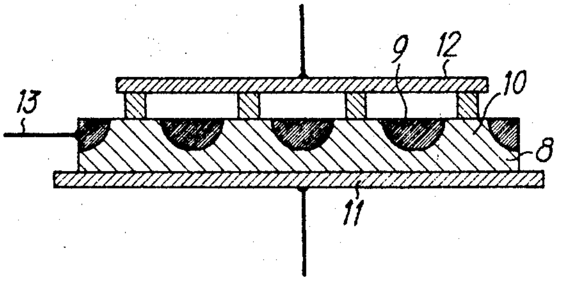

The semiconductor devices of prior art, to which the present invention adds improvements, are represented in FIGS. 1, 2 and 3.

The prior art tecnetron illustrated in FIG. 1 is constituted by a kind of brush made of semiconductor material, for example n-type germanium, having a number of rods 1, issuing from a common base or body 2, to which they are perpendicular, and partially sheathed by a metallic gate 3, for example of indium, in one piece, surrounding the rods and forming with them a diode either by rectifying contact, or by junction by alloy of semiconductors of opposite types. The free upper extremities of the rods 1 are then joined together by a metallic electrode 4 which is welded there, while another metallic electrode is welded to the base 2. The intermediary electrode of this three-electrode structure is constituted by the gate 3. This semiconductor device is particularly applicable in the field of low frequencies and especially in the high power field, for the capacity of the gate 3 with respect to the base 2 makes the device unsuitable for applications in the high frequency field.

The structure according to FIG. 2 eliminates this drawback by providing the rods 1 with a neck 6 and by limiting the thickness of gate 7 to the height of this neck. The gate-base stray-capacity is thus greatly reduced and the structure becomes useable in amplifiers of very high frequency, but its manufacture has given rise to great difficulties hitherto.

The structure according to FIG. 3 shows no longer outer visible teeth. It is realized by diffusion in the gaseous phase, into a semiconductor plate 8 (of n-type germanium or n-type silicon for example) the surface of which is provided with an appropriate mask, of a conveniently chosen impurity (for example, indium, aluminum or boron). This diffusion creates a layer which has the configuration of a gate 9 of p-type surrounding the teeth 10 of n-type. An electrode 11 is welded on to the base and another electrode with spikes is welded by these spikes on to the tops of the teeth 10; finally, a third electrode 13 is welded on to the gate 9. This structure can be used for low as well as high frequencies, in this latter case by means of the reduction to a minimum of the section of the wire-like elements, stated in quotes as "wires" 9 of the gate, as likewise of the section of its mesh-like elements, stated in quotes as "meshes" or teeth 10.

Figure 4:
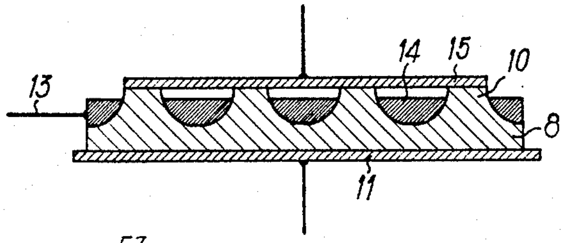

The manufacture of the tecnetrons shown in FIGS. 1 to 3 requires the welding of an electrode in the form of a plate, whether plane or provided with spikes or tips, on to the tops of a number of visible teeth (FIGS. 1 and 2) or mesh-like elements forming teeth (FIG. 3). This welding operation presents difficulties in all cases. It can be achieved in the case of FIG. 3 by disengaging these teeth by selective electrolytic etching, which gives a structure presenting a gate 14 withdrawn in respect of the upper extremities of the teeth 15, according to FIG. 4. However, the welding on to the tops of the teeth remains difficult and is only possible if the dimensions of the teeth are sufficiently large. In view of the fact that there exists, as is well known, a close relationship between the diameter of the teeth and the thickness of the gate and since this thickness is a major factor for limiting the operating frequency, it will be seen that the frequency limit cannot be very high.

Figure 4A:
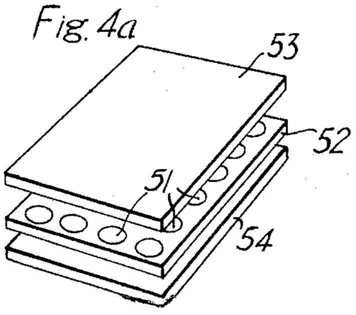

FIG. 4*a* shows a prior art field-effect transistor comprising a plurality of cylindrical semi-conductor elements 51 spaced apart and arranged in a matrix having one type of conductivity. These elements are diffused in a slab 52 of the opposite type of conductivity. After diffusion two layers 53 and 54 are deposited onto the slab faces by epitaxial growth. As already explained, in these three-layer transistors the teeth have a length which is equal to the slab thickness and it is therefore not possible by this diffusion method to obtain teeth of such a length as indicated below (some microns).

Figure 5:
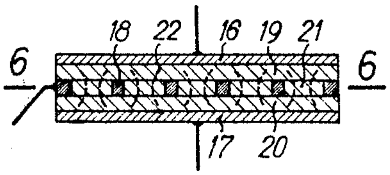

FIG. 5 shows an idealized multi-rod tecnetron according to the invention. It comprises two terminal electrodes 16 and 17 forming respectively the source and drain of the field-effect device and an intermediary electrode 18 constituting a net-like gate. This gate is entirely embedded by two semiconductor discs 19 and 20, on each side of the gate, joined together by teeth 21 through the meshes of the gate 18, integral with each other and integral with the teeth. The gate "wires" are formed by a semiconductor of a type opposite to that of the semiconductor surrounding them; the meshes are of n-type, the wires are of p-type. The dotted lines 22 represent current paths between the terminal electrodes and through the meshes 21 of the gate 18. As will be explained below in detail, the parts 18, 19, 21 are parts of a single original semiconductor wafer and part 20 is either a part of the same wafer or a layer added thereto according to whether the field-effect transistor is made by one or the other of two possible fabrication processes.

Figure 6:
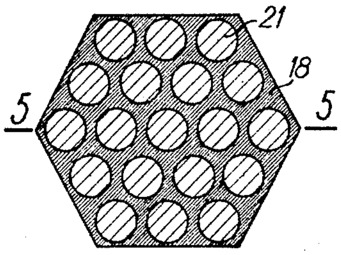
Figure 7:
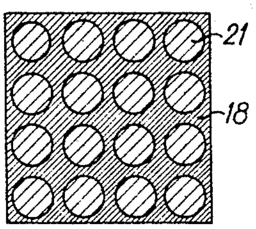
FIGS. 7 to 10 represent the possible forms and arrangements of the teeth or mesh-like elements of the gate.
Figure 8:
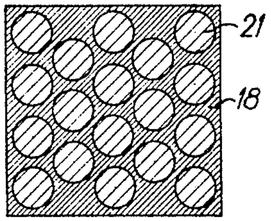
Figure 9:
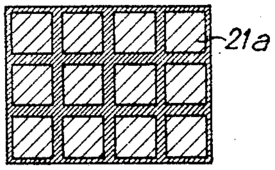
Figure 10:
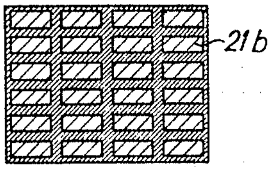

FIG. 6 is a cross-section of the device taken along line 6—6 of FIG. 5. It shows an example of distribution of teeth or mesh-like elements 21 of the gate at the tops of concentric hexagons. This distribution ensures maximal spatial density of the mesh-like element, all other conditions remaining equal. However, other distributions, as for example in the form of perpendicular lines and columns (FIG. 7) or in the form of quincunx (FIG. 8) can be used. On the other hand, the circular form of the teeth or mesh-like elements is preferential, but not compulsory; for example, square mesh (**21*a* following FIG. 9) or rectangular ones (21*b*** following FIG. 10) or elliptical ones could also be used if this appeared indicated for manufacturing reasons.

Figure 11:
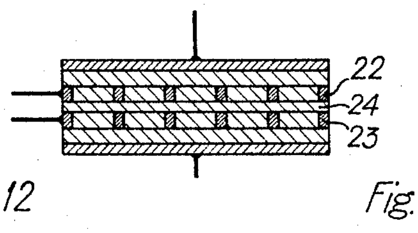
FIG. 11 is a cross-sectional view of an idealized two-gate tecnetron.

FIG. 11 shows an enlarged cross-section of an idealized structure with two gates 22 and 23 embedded and separated by a semiconductor layer 24; the interest of such a structure, similar to that of a thermionic tube with two control electrodes, is obvious, and will be dealt with further on.

It has been mentioned that FIGS. 5 and 11 showed idealized structures, so as to better explain their basic principle. The following figures show the structural details of the gates and wtih the help of these figures two forms of realization will be described as examples.

Figure 12:
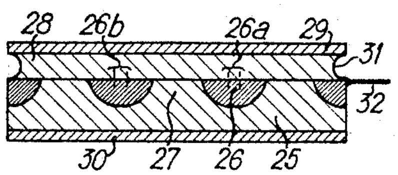
FIG. 12 is an enlarged cross-sectional view of a tecnetron with an embedded gate, produced according to a first process.

The structure represented in FIG. 12 is constituted with as a starting material a plate 25 of n-type silicon into which is diffused through the holes of a mask covering one of the faces, a p-type impurity, for example boron, forming the wires of the gate 26 which surround the teeth 27. The delimitation of the mesh-like elements of the gate will be ensured by applying the known process of masking the plate by means of an oxide layer created at the places for the teeth. It is understood that the circles, squares or rectangles of oxide must go over the edges of the places for the teeth, so as to ensure that the diffusion of the p-type impurity from the surface towards the inside of the plate occurs in all directions simultaneously although not necessarily at the same speed. The holes of the oxide mask are indicated in FIG. 12 by dotted lines 26*a* and 26*b* and for better clarification reproduced in detail in whole lines on FIG. 13 showing the oxide layer provided with holes.

Following the diffusion, the surface is washed with trichlorethylene and hydrofluoric acid, and may be treated in a chemical bath of the following composition by way of example: hydrofluoric acid 15 $cm.^3$, nitric acid 15 $cm.^3$, acetic acid 25 $cm.^3$. The surface is finally rinsed with de-ionized water and then dried in vacuum. The layer 28 of n-type silicon is then deposited by epitaxial growth. The formation of this epitaxial layer may be effected by the so-called pyrolysis technique in which electrolytic deposition at high temperature is achieved starting from silicon tetrachloride which is doped with phosphorus chloride and, optionally, the decomposition can occur by evaporation in vacuo.

One then proceeds with the welding of the terminal electrodes 29 and 30 forming the source and drain electrodes, respectively, and finally, one obtains, as shown in FIG. 12 at reference numeral 31, the disengagement of the circumference of the gate by selective electrolytic etching which is carried out in diluted alkali, e.g. dilute soda or potash, and can be simply effected by plunging the structure in this bath, while the electrode 29 is connected to the positive pole of a current source and a separate external electrode is to the negative pole. The connection 32 of the gate can now be soldered and thus the structure is completed.

Figure 13:
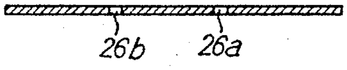
FIG. 13 is the cross-sectional view of a perforated oxide mask enabling the diffusion of the net of the tecnetron gate of FIG. 12.
Figure 14:
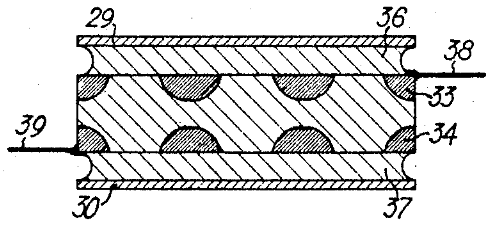
FIG. 14 is an enlarged cross-sectional view of a typical two-gate tecnetron.
Figure 14A:
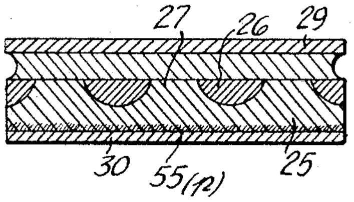
FIGS. 14*a* and 15*a* are illustrations of tecnetrons with an embedded gate and a rectifying drain and a partially ohmic, partially rectifying drain, respectively.

FIG. 14*a* differs from FIG. 13 only by the fact that before the welding of the drain electrode 30, the face of plate 25 has not yet been diffused, the surface of the not-diffused plate 25 is submitted on all of its area to a p-type diffusion of such a depth that the p-type layer 55 thus obtained permits only a part of the depth and does not meet or reach the gate 26.

Figure 15:
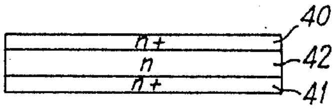
FIGS. 15 to 17 are enlarged cross-sectional views of a one-gate tecnetron with its gate embedded, in three successive stages of manufacture according to a second process.
Figure 15A:
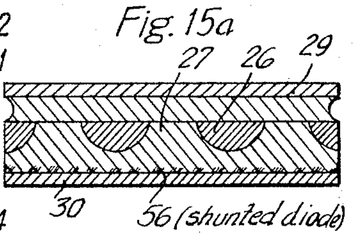

FIG. 15*a* differs from FIG. 13 only by the fact that before the welding of the drain electrode 30, the face of plate 25 which is not yet diffused is submitted to a p-type diffusion on discrete zones of its area through a mask in order to obtain a layer 56 having interlaced overlapping or overlying p-type and n-type zones.

By the same technique, a structure with two gates, such as shown in FIG. 14 (gates 33 and 34) can be achieved. One proceeds with the p-type diffusion of these gates simultaneously, starting from the two faces of the plate by leaving unaltered a layer of n-type silicon between them. Following this, the two faces as described above for one of them relating to FIG. 12, are cleaned and possibly repolished, after which the two external layers of n-type silicon, 36 and 37, are built by epitaxy. Then the terminal electrodes 29 and 30 are welded and the two gates disengaged so as to be able to solder on to them the leads 38 and 39, for example by the same process of selective electrolytic etching as before, but this time joining the two electrodes 29 and 30 together to the positive pole.

Figure 16:
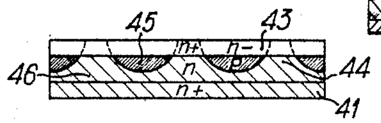
Figure 17:
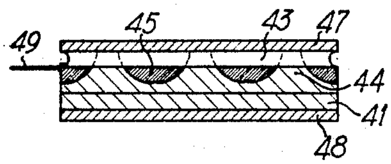

Another manufacturing process is illustrated in FIGS. 15, 16 and 17. In this case, one diffuses at first into a plate of semiconductor and at least into one of the faces an impurity of the majority carrier type, that is to say that for example for n-type silicon one diffuses antimony or arsenic which results in a heavily doped layer $n^+$ on this or on both of these faces. Preferably a substance is chosen which has a small diffusion coefficient, so that this layer is disturbed as little as possible by the subsequent operations which are performed. FIG. 15 shows the case where a double layer $n^+$ 40–41 is formed on the two faces on each side of the median n-type layer, 42. The superficial concentration of the impurities can be, for example, of the order of $10^{18}$ per $cm.^3$.

Thereafter follows the masking operation and by creating a layer of silicon oxide on the circumference and on the two faces, one of these faces is completely masked; while on the other masking is limited to the sites for creating the teeth or, more precisely, is extended to sites having a surface larger than that of the teeth so as to allow for the omnidirectional growth of the diffused layer as has been explained in the case of FIG. 12. Through the holes thus formed in the masking diffusion process an impurity of the minority carrier type is diffused, for example, for n-type silicon is treated with a dopant which consists of boron and starting from a suitably chosen concentration, which may be at a concentration level of the same order as for the majority carrier impurity, so as to compensate in part for the effect of the majority carrier type of the layer, which type nonetheless remains predominant. At a certain distance from the surface the minority impurity, owing to the fact that its diffusion coefficient is greater, surpasses the majority impurity, and thus constitutes a p-type layer in the form of a gate. FIG. 16 illustrates the result of this operation. One observes on the upper part of the plate the semiconductor layer 43 which has parts heavily doped denoted by $n^+$ and parts near-compensated but still of the n-type denoted by $n^-$ (the punctuated line denotes the overflow from the diffusion of the p-type impurity). Then follows the median layer comprising the closely interlaced zones of p and n types: teeth 44 of n-type semiconductor and wires 45 of the gate of p-type semiconductor; then follows a relatively thin layer 46 of n-type semiconductor, unaltered by the diffusion, and the layer 41 of $n^+$ type already mentioned.

To complete the structure, there remains only the step of cleaning the two faces (particularly to eliminate the oxide layer), to then weld on to them the terminal electrodes 47 and 48, to disengage laterally the gate 45 and to solder on to the gate the median connection 49 as in the cleaning, welding and soldering operating techniques previously set out.

It results from FIG. 16 that the superficial regions below the holes of the mask of oxide remain of n-type due to the former diffusion of a majority impurity. If this majority impurity is diffused onto the whole face of the semiconductor body, except a narrow strip along an edge of said face, and if this strip is not masked during the minority impurity diffusion, it will be superficially of p-type. Consequently it makes it possible to weld the source and gate contacts on to the same face of the plate and to dispense with the lateral disengagement. In the same way, before the epitaxial growth process, a portion of the face of the body already submitted to the minority impurity diffusion is left oxidized and correlatively does not grow up epitaxially.

The technique of FIGS. 15 to 17 adapts the manufacture of a tecnetron with two control grids in cascade and to this end it is sufficient to diffuse the minority impurity across the two faces which have both been covered with suitably perforated masks. The final result will be rather similar to that shown in FIG. 14, with a layer having $n^+$ regions and near-compensated regions $n^-$ replacing the epitaxially grown layers.

The three-electrode tecnetron conforming to FIG. 12 or FIG. 17 can be advantageously employed as an amplifier and as an oscillator in the fields of electronics and telecommunications. It is then necessary to make the drain contact quite ohmic, which may be achieved by either using a soldering material doped with an n-type impurity (for silicon, soldering with antimony-gold alloy), or by first applying, by diffusion over the drain surface, a n-type heavily doped layer, for example antimony-doped, as shown in FIGS. 15 to 17. In this amplifier or oscillator embodiment, the tecnetron functions with the gate being constantly polarized in the reverse direction, thereby avoiding any injection of minority carriers into the teeth of the tecnetron and thus, in every situation, the gate current is practically negligible.

For applications in the field of high currents, and particularly as controlled rectifier and as switching device, the drain electrode will preferably be non-ohmic either rectifying as in FIG. 14*a* or equivalent to a diode shunted by a resistance as in FIG. 15*a*. In the last case, the drain may be executed according to the teachings of French patent application No. 1,301,942 filed July 11, 1961. This arrangement assures under minimal voltage drop a massive injection of minority carriers into the channels between source and drain in the "on" state of such a tecnetron. On the other hand it will be advantageous in this same massive injection state of the tecnetron to have the gate diode function in the forward direction, so as to ensure, as described in this same patent, an injection, or at least a reinjection, by the gate of minority carriers into the said channels between source and drain.

The four-electrode tecnetron conforming to FIG. 14 can serve multiple uses in the field of telecommunications, for example as an oscillator-converter set. At the same time, the gate on the drain side can also serve as a grounded screen so as to reduce the feedback to a minimum. On the other hand, if the two gates are placed sufficiently close to each other, so that the space charge created by the one can penetrate into the other, the two-gate tecnetron may play the part of the arrangement described in U.S. Patent No. 2,921,265 issued January 12, 1960 to the present application. In this arrangement, the upward gate, starting from the source, will serve only as an electrostatic lens and only the downward gate, playing the part of control grid, will be subjected to the signal voltage.

Finally, in the field of heavy currents, one may advantageously use the two-gate tecnetron, for example in the place of two elements in series, thus realizing much compact set-ups and reducing the number of solderings required.

The use of an oxide mask obtained by the well-known photolithographic process enables one to obtain gate "wires" of only a few microns in width, a remarkable achievement in terms of the new result attained thereby and since the diameter of the mesh-like elements are also of the order of a few microns, the distance between the centers of adjacent meshes may be reduced to a very small value, such as 6 to 10 microns for example.

As a simple example and only in regard to a three-electrode signal translating device, the dimensional and electrical characteristics of two representative models chosen from this latter type of tecnetron are given hereinafter:

A. Amplifier and oscillator for telecommunications:

| | |
|---|---|
| Material: n-type silicon of a resistivity: | 0.75 ohm. cm. |
| Diameter of the teeth (at the constricted section) | 4$\mu$. |
| Spacing of the teeth (inter axes) | 9$\mu$. |
| Thickness of the gate | 3$\mu$. |
| Number of meshes per mm.$^2$. | 10,000. |
| Blocking tension | $\approx$−5 volts. |
| Drain saturation current | $\approx$1.5 A. per mm.$^2$. |
| Transconductance | $\approx$1 A. per volt. per mm.$^3$. |
| Input resistance at low frequency | >1 megohm per mm.$^2$. |
| Internal resistance at low frequency | >1 kilom per mm.$^2$. |
| Maximum output power as oscillator or class A amplifier | $\approx$2 w. per mm.$^2$. |
| Merit factor | $\approx$1 Gigacycle per second. |
| Frequency limit in operation | $\approx$15 Gigacycles per second. |

This frequency, however, does not constitute an intrinsic limit, since, for example, with a micro-gate where the diameter of the teeth and the thickness of the grid would be reduced to 1$\mu$, a frequency limit of the order of 50 Gigacycles per second could be attained.

B. Power model for strong currents:

| | |
|---|---|
| Material: n-type silicon of resistivity ohm. cms | 15 |
| Diameter of teeth (at the constricted section) | 20$\mu$ |
| Spacing of the teeth | 100$\mu$ |
| Thickness of the gate | 15$\mu$ |
| Total thickness of the plate | 150$\mu$ |
| Number of meshes per cm.$^2$ | $\approx$10,000 |
| Blocking voltage volts | $\approx$−15 |
| Maximal voltage between source and drain in blocked state volts | 400 |
| Service current A./cm.$^2$ | 10 |
| Voltage drop in conducting state volt | $\approx$1.25 |

It is understood that dimensions of plates of the order of 10 cm.$^2$ can be contemplated and that, on the other hand, owing to the fact that tecnetrons function in parallel without any fitting, and unlimited number of plates may be associated. Thus the nominal current can be increased at will and also, if necessary, the voltage drop at the terminals reduced to a large extent.

Referring backs to FIGS. 12 and 17, it is seen that the portions 25 and 41 form an unaltered layer in the original semiconductor plate since the p-type doped volume in the form of the wires of a net or trellis does not reach the free surface of the plate. Consequently the cross-section area gate darts 26 or 45 decreases and the cross-section of the teeth 27 or 44 increases from the inside of the plate in the direction of the other free surface. The teeth have variable sections and in the case of epitaxial growth, this is due to the fact that only one epitaxially grown layer is added to the plate. The advantages of variable section rods or teeth in tecnetrons are discussed in U.S. Patent 2,939,057 issued May 31, 1960 to the present applicant. The pinch-off voltage is lowered; the voltage gain and the transconductance are increased. It is reminded that when the internal rods have a variable cross-sectional area, the source electrode is on the side of the minimum area, i.e. 29 in FIG. 12 and 47 in FIG. 17. In the case of a two-gate device (FIG. 14), the source electrode is on the side of the minimum area of the teeth of the control gate; in FIG. 14 if 33 is the control gate, 29 is the source, 34 is the screen grid and 30 the drain.

On the other hand, it is understood that the forms of manufacture, particularly the design of the gate, and the semiconductor materials used, semiconductors of group IV or intermetallic compounds of groups III and V of the periodic classification of elements, can vary without the resulting devices deviating from the scope of this invention.

What I claim is:

1. A field-effect translating device comprising a semiconductor plate having two parallel great faces including a first zone of a given conductivity type contiguous with the first face thereof, a second zone having first portions of the type of conductivity opposite to said given conductivity type formed by a first impurity of said opposite type of conductivity and large diffusion coefficient diffused from said second face and unaltered second portions of said given type of conductivity, said first and second portions respectively forming mesh-like channels and a wire-like gate, a third zone generally of said given type of conductivity having first portions adjacent said wire-like gate, heavily doped in said given type and formed by a second impurity of said given type of conductivity and small diffusion coefficient diffused from said second face and second portions slightly doped in said given type and formed both by the said first impurity of said opposite type of conductivity and large diffusion coefficient and the said second impurity of said given type of conductivity and small diffusion coefficient diffused from said second face, source and drain connections respectively to said first and third zones and a gate connection to said wire-like gate.

2. A field-effect translating device comprising a semiconductor plate having two parallel great faces including a first zone of one conductivity type contiguous with the first face thereof, a second zone of the same conductivity type contiguous with the second face thereof and remote from the first zone, a plurality of discrete substantially rod-shaped semiconductor channels of the same conductivity type, perpendicular to said first and second zones and integral therewith, a net-like gate zone of opposite conductivity type diffused in the portion of the plate intermediate between said first and second zones, surrounding said channels and forming a junction therebetween, an ohmic source connection to said first zone, a rectifying drain connection to said second zone and a gate connection to said net-like gate zone.

3. A field-effect translating device comprising a semiconductor plate having two parallel great faces including a first zone of one conductivity type contiguous with the first face thereof, a second zone of the same conductivity type contiguous with the second face thereof and remote from the first zone, a plurality of discrete substantially rod-shaped semiconductor channels of the same conductivity type, perpendicular to said first and second zones and integral therewith, a net-like gate zone of opposite conductivity type diffused in the portion of the plate intermediate between said first and second zones, surrounding said channels and forming a junction therebetween, an ohmic source connection to said first zone, a drain connection to said second zone comprising areas forming ohmic contacts and other areas forming rectifying contacts with said second zone and a gate connection to said net-like gate zone.

4. A field-effect translating device comprising a first flat semiconductor layer of a given type of conductivity having two plane parallel faces, a plurality of dart-shaped regions in the first of said faces, the conductivity of said dart-shaped regions being of the type which is opposite to said given type, said dart-shaped regions extending inside said layer and delimiting therein rod-shaped regions wholly within and less in depth dimensions than the thickness of said layer, the conductivity of said rod-shaped regions being the same as said given type and forming a rectifying junction therewith, a second flat layer having two plane parallel faces of semiconductor material of the same type of conductivity as the first layer and of the same area which is adjacent and integral to said first face of the first layer, two electrodes having ohmic contact with the free faces of said both layers respectively and a gate electrode having ohmic contact with the dart-shaped regions.

5. A field-effect translating device comprising a first flat semiconductor layer of relatively low conductivity in a given type having two plane parallel faces, a plurality of dart-shaped regions in the first of said faces, the conductivity of said dart-shaped regions being of the type which is opposite to said given type, said dart-shaped regions extending inside side layer and delimiting therein rod-shaped regions wholly within and less in depth dimensions than the thickness of said layer, the conductivity of said rod-shaped regions being the same as said given type and forming a rectifying junction therewith, a second flat layer having two plane parallel faces of semiconductor material of the same type of conductivity as the first layer and of the same area, said second flat layer being adjacent and integral to said first face of the first layer, two electrodes having ohmic contact with the free faces of said both layers respectively and a gate electrode having ohmic contact with the dart-shaped regions.

6. A field-effect translating device comprising a first flat semiconductor layer of relatively low conductivity in a given type having two plane parallel faces, a plurality of dart-shaped regions in the first of said faces, the conductivity of said dart-shaped regions being of the type which is opposite to said given type, said dart-shaped regions extending inside said layer and delimiting therein rod-sharped regions wholly within and less in depth dimensions than the thickness of said layer, the conductivity of said rod-shaped regions being the same as said given type and forming a rectifying junction therewith, a second flat layer having two parallel plane faces of semiconductor material of the same type of conductivity as the first layer and of the same area, said second flat layer being epitaxially grown onto said first face of the first layer, two electrodes having ohmic contact with the free faces of said both layers respectively and a gate electrode having ohmic contact with the dart-shaped regions.

7. A field-effect translating device comprising a first flat semiconductor layer of relatively low conductivity in a given type having two plane parallel faces, a plurality of dart-shaped regions in the first of said faces, the conductivity of said dart-shaped regions being of the type which is opposite to said given type and the cross-section area of said dart-shaped regions decreasing in extent from said face to the inside of the layer, said dart-shaped regions delimiting in said layer rod-shaped regions wholly within and less in depth dimensions than the thickness of said layer, the conductivity of said rod-shaped regions being the same as said given type, forming a rectifying junction therewith and the cross-section area of said rod-shaped region increasing in extent from said face to the inside of the layer, a second flat layer having two plane parallel faces of semiconductor material of the same type of conductivity as the first layer and of the same area, said second flat layer being adjacent and integral to said first face of the first layer, two electrodes having ohmic contact with the free faces of said both layers respectively and a gate electrode having ohmic contact with the dart-shaped regions.

8. A field-effect translating device comprising a semiconductor plate having two parallel great faces including first and second zones of a given conductivity type respectively contiguous with the first and second faces thereof, a third zone of said given conductivity type located midway said two faces, a first plurality of discrete substantially rod-shaped semiconductor channels of said given conductivity type perpendicular to said first and third zones and integral therewith, a first net-like gate zone of the conductivity type opposite to said given conductivity type surrounding the channels of said first plurality and forming a junction therebetween, a second plurality of discrete substantially rod-shaped semiconductor channels of said given conductivity type perpendicular to said second and third zones and integral therewith, a second net-like gate zone of the conductivity type opposite to said given conductivity type surrounding the channels of said second plurality and forming a junction therebetween, source and drain connections respectively to said first and second zones and two gate connections respectively to said first and second net-like gate zones.

9. A field-effect translating device comprising a semiconductor plate having two parallel great faces, including a first zone of a given conductivity type located midway said two faces, second and third zones both having first portions of the type of conductivity opposite to said given conductivity type respectively diffused onto said first and second faces and second portions of said given type of conductivity, said first and second portions respectively forming mesh-like channels and a wire-like gate, fourth and fifth zones of said given type of conductivity epitaxially grown respectively from said first and second faces, source and drain connections respectively to said fourth and fifth zones and two gate connections respectively to said two wire-like gates.

10. A field-effect translating device comprising a semiconductor plate having two parallel great faces including a first zone of a given conductivity type located midway said two faces, second and third zones both having first portions of the type of conductivity opposite to said given conductivity type formed by a first impurity of said opposite type of conductivity and large diffusion coefficient diffused respectively from said first and second faces and second portions of said given type of conductivity, said first and second portions respectively forming mesh-like channels and two wire-like gates, fourth and fifth zones generally of the same type of conductivity as the first zone both having first portions formed by a second impurity of said given type of conductivity and small diffusion coefficient respectively diffused from said first and second faces and second portions formed both by the said first impurity of said opposite type of conductivity and large diffusion coefficient and the said second impurity of said given type of conductivity and small diffusion coefficient respectively diffused from said first and second faces, said second portions twofold diffused being of said given type of conductivity, source and drain connections respectively to said fourth and fifth zones and two gate connections respectively to said two wire-like gates.

11. A field-effect translating device comprising a semiconductor base body of a given type of conductivity and having first and second parallel plane faces, in both of said faces a plurality of diffused regions of the type of conductivity opposite to said given conductivity type interconnected with each other to form two net-like gate regions and each extending over a height lesser than half the spacing between said plane faces, said diffused regions delimiting two pluralities of discrete unaltered regions of said given type of conductivity in the semiconductor body, said discrete unaltered regions a junction with said gate regions, two epitaxially grown layers onto said first and second faces and having said given type of conductivity, source and drain plane electrodes respectively connected to the free faces of said two epitaxially grown layers and two gate connections to said two net-like gate regions.

12. A field-effect translating device comprising a semiconductor base body of a given type of conductivity having first and second parallel plane faces, in both of said faces a plurality of diffused regions of the type of conductivity opposite to said given conductivity type interconnected with each other in each plurality to form two net-like one-piece gate regions, each extending over a height lesser than half the spacing between said plane faces, second pluralities of discrete non-diffused regions of said given type of conductivity having the shape of darts whose cross-section area respectively increases from the first face to the inside of said base body and from the second face to the inside of said base body, said discrete non-diffused regions respectively forming a junction with the two one-piece gate regions, two epitaxially grown layers onto said first and second faces and having said given type of conductivity, source and drain plane electrodes respectively connected to the free faces of said two epitaxially grown layers and two gate connections to said two net-like gate regions.

13. A field-effect translating device comprising a semiconductor base body of a given type of conductivity having two parallel plane faces, in both said faces a twofold diffused layer by a first impurity substantially increasing the conductivity in said given type and by a second impurity having a type of conductivity opposite to the conductivity type of said base body, two pluralities of dart-shaped regions doped by said second impurity and each extending inside said base-body below one twofold diffused layer along a depth lesser than half the thickness of the plate, the dart-shaped regions of each plurality being integral with each other and forming a one-piece gate region and delimiting in said base-body rod-shaped regions whose conductivity is of the given type already present in said base-body, source and drain plane electrodes connected to said two parallel plane faces and two gate connections to said two gate regions.

References Cited by the Examiner

UNITED STATES PATENTS 3,025,438 3/1962 Wegener ........... 317—235

JOHN W. HUCKERT, *Primary Examiner.*

R. SANDLER, *Assistant Examiner.*